(12) United States Patent
Chen et al.

(10) Patent No.: US 10,281,772 B2
(45) Date of Patent: May 7, 2019

(54) LIQUID CRYSTAL DISPLAY PANEL

(71) Applicant: HON HAI PRECISION INDUSTRY CO., LTD., New Taipei (TW)

(72) Inventors: I-Wei Chen, New Taipei (TW);
Hsin-An Cheng, New Taipei (TW);
Wun-Zong Chang, New Taipei (TW);
Hao-Ting Tien, New Taipei (TW);
I-Min Lu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 2 days.

(21) Appl. No.: 15/792,764

(22) Filed: Oct. 25, 2017

(65) Prior Publication Data

US 2018/0113339 A1   Apr. 26, 2018

Related U.S. Application Data

(60) Provisional application No. 62/412,347, filed on Oct. 25, 2016.

(51) Int. Cl.
*G02F 1/1339* (2006.01)
*G02F 1/1335* (2006.01)
*G02F 1/1337* (2006.01)
G02F 1/1343 (2006.01)
G06F 3/041 (2006.01)
H01L 21/77 (2017.01)

(52) U.S. Cl.
CPC .......... *G02F 1/1339* (2013.01); *G02F 1/1337* (2013.01); *G02F 1/13394* (2013.01); *G02F 1/133512* (2013.01); *G02F 1/133514* (2013.01); G02F 1/1343 (2013.01); G02F 2001/13398 (2013.01); G06F 3/0412 (2013.01); H01L 2021/775 (2013.01)

(58) Field of Classification Search
CPC ............. G02F 1/13392; G02F 1/13394; G02F 1/1337; G02F 1/1339; G02F 1/133512; G02F 1/133514; G02F 1/1343
See application file for complete search history.

(56) References Cited

U.S. PATENT DOCUMENTS

| | | | |
|---|---|---|---|
| 2012/0105759 A1* | 5/2012 | Park | G02F 1/13392 349/43 |
| 2013/0135569 A1 | 5/2013 | Nagami | |
| 2017/0146843 A1* | 5/2017 | Tang | G02F 1/13394 |

FOREIGN PATENT DOCUMENTS

TW          200813536 A       3/2008

* cited by examiner

*Primary Examiner* — Dung T Nguyen
(74) *Attorney, Agent, or Firm* — ScienBiziP, P.C.

(57) ABSTRACT

An LCD device includes a TFT array substrate, a liquid crystal layer, and a plurality of photo spacers. The photo spacers are located inside the liquid crystal layer. The TFT array substrate includes a pixel electrode layer and an alignment layer. The alignment layer is arranged on the of TFT array substrate on the side near the liquid crystal layer. The pixel electrode layer is arranged on the alignment layer on the side far away from liquid crystal layer; the alignment layer includes a plurality of contact portion. The bottom of the photo spacers are holding with the contact portions. A plurality of block portion is adjacent to the contact portions. The block portion is a protrusion formed toward the color filter substrate with respect to the contact portion, so that the displacement of the photo spacers on the TFT array substrate can be limited.

12 Claims, 5 Drawing Sheets

LIQUID CRYSTAL DISPLAY PANEL

FIELD

The subject matter herein generally relates to display technology, particularly to a liquid crystal display (LCD) panel.

BACKGROUND

A liquid crystal display (LCD) mainly includes a thin film transistor (TFT) array substrate, a color filter (CF) substrate, a liquid crystal layer, and an alignment layer. The liquid crystal layer has specific arrangement directions and is located between the TFT array substrate and the CF substrate. The alignment layer is formed in an inner side of TFT array substrate and the CF substrate for the alignment of liquid crystal molecules. To maintain uniform cell gap in the liquid crystal panel, generally, a certain quantity of photo spacers (PSs) is be arranged inside the liquid crystal layer.

In particular, PSs, which are arranged between the TFT array substrate and the CF substrate, hold the TFT array substrate and the CF substrate. Therefore, the liquid crystal panel can have a uniform cell gap. In the fabrication process of slimming, polishing, cover glass bonding, transportation, and et cetera, or in the reliability testing process, temporary relative displacement will occur between the TFT array substrate and CF substrate. This relative displacement will cause the PSs to scrape the alignment layer against the TFT array substrate or the CF substrate. The scraped alignment layer thus cannot align well with the liquid crystal and generate spots on LCD that can lead to low quality and yield rate.

BRIEF DESCRIPTION OF THE DRAWINGS

Implementations of the present disclosure will now be described, by way of example only, with reference to the attached figures.

DETAILED DESCRIPTION

Figure 1:
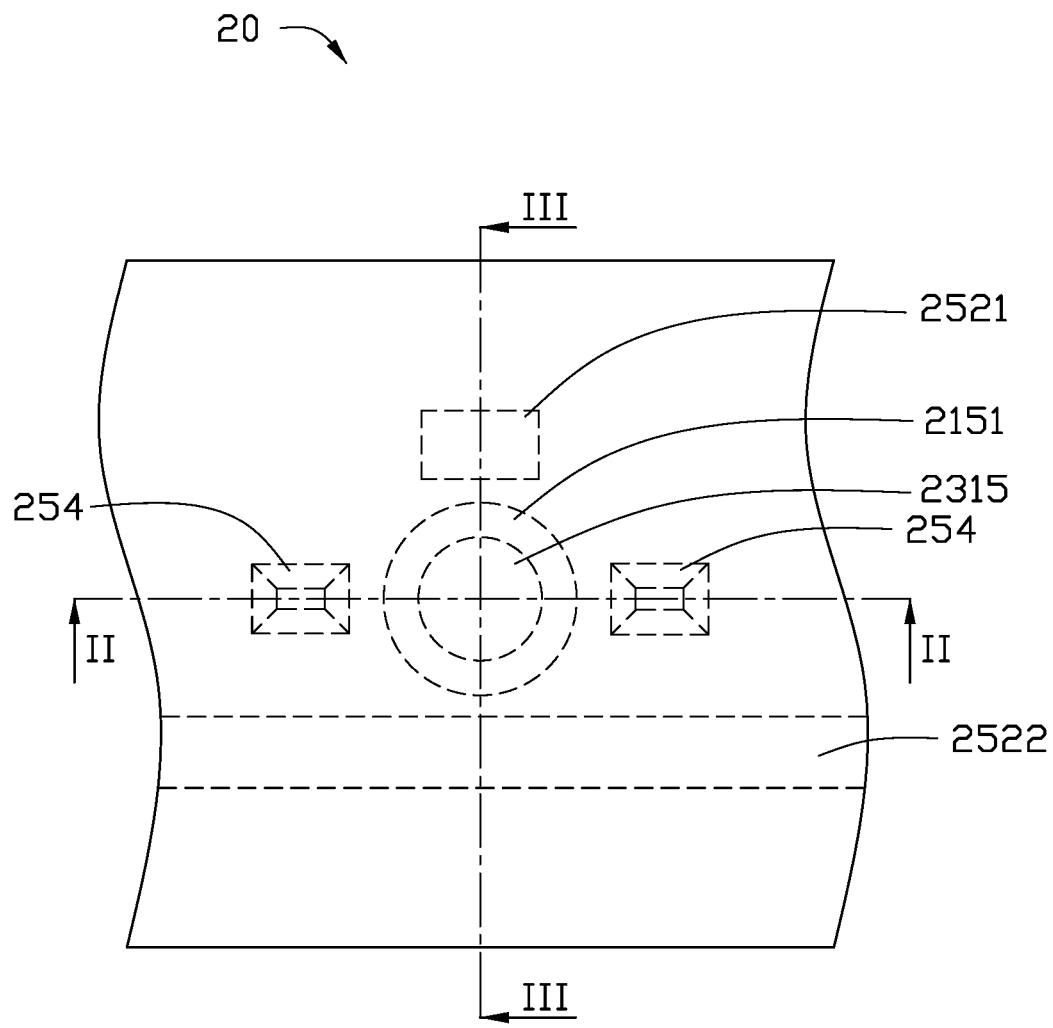
FIG. 1 is a partial planar view of an LCD according to a first exemplary embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

In the disclosure, block portions are arranged on the TFT array substrate, which is a kind of structure that can restrict the relative displacement of PSs to the TFT array substrate; therefore, the alignment layer can be prevented effectively scraping by PSs. Furthermore, the block portions can be, for example, a metal block that can electrically connect to pixel electrodes on the TFT substrate, and this metal block can also have other electrical functions, for example, an embedded touch sensing electrode and a common electrode. On the other hand, the black matrix on the CF substrate is arranged on the relative positions of the PSs, so that the black matrix can effectively cover the light leakage caused by small-scale damage and can improve the quality and yield rate of liquid crystal panel.

Hereinafter, an exemplary embodiment of the present disclosure will be described in detail with reference to accompanying drawings.

The First Exemplary Embodiment

Figure 2:
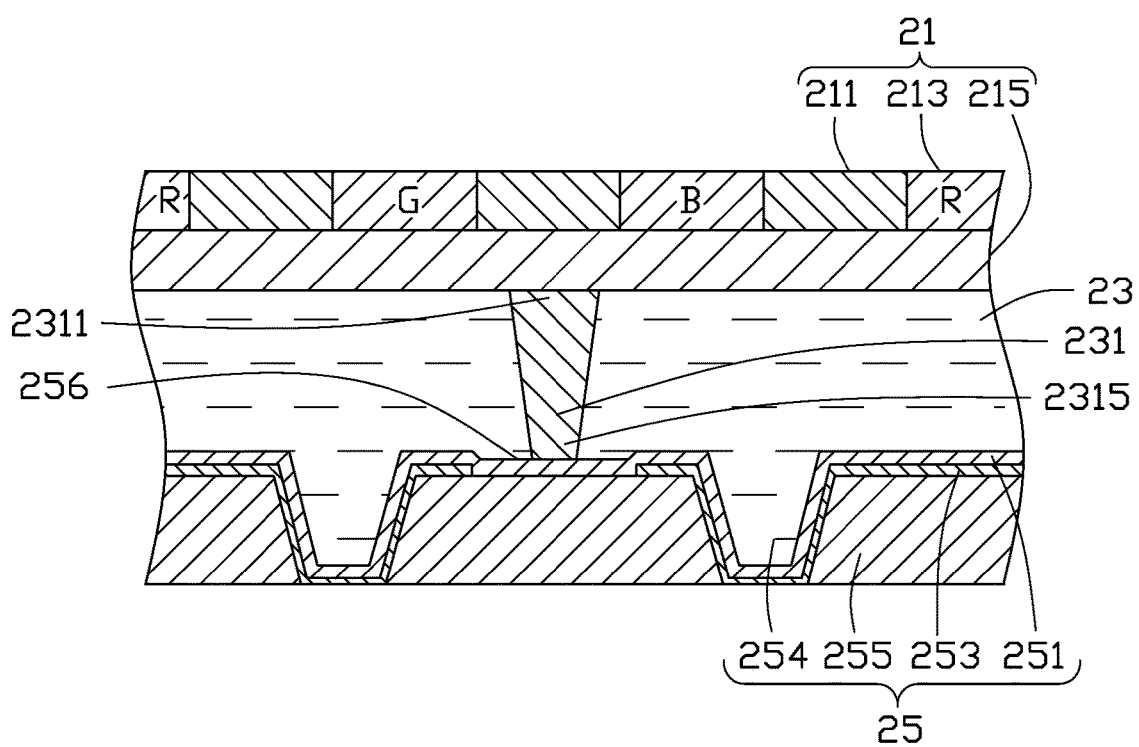
FIG. 2 is a cross-sectional view of the LCD in FIG. 1 along line II-II.
Figure 3:
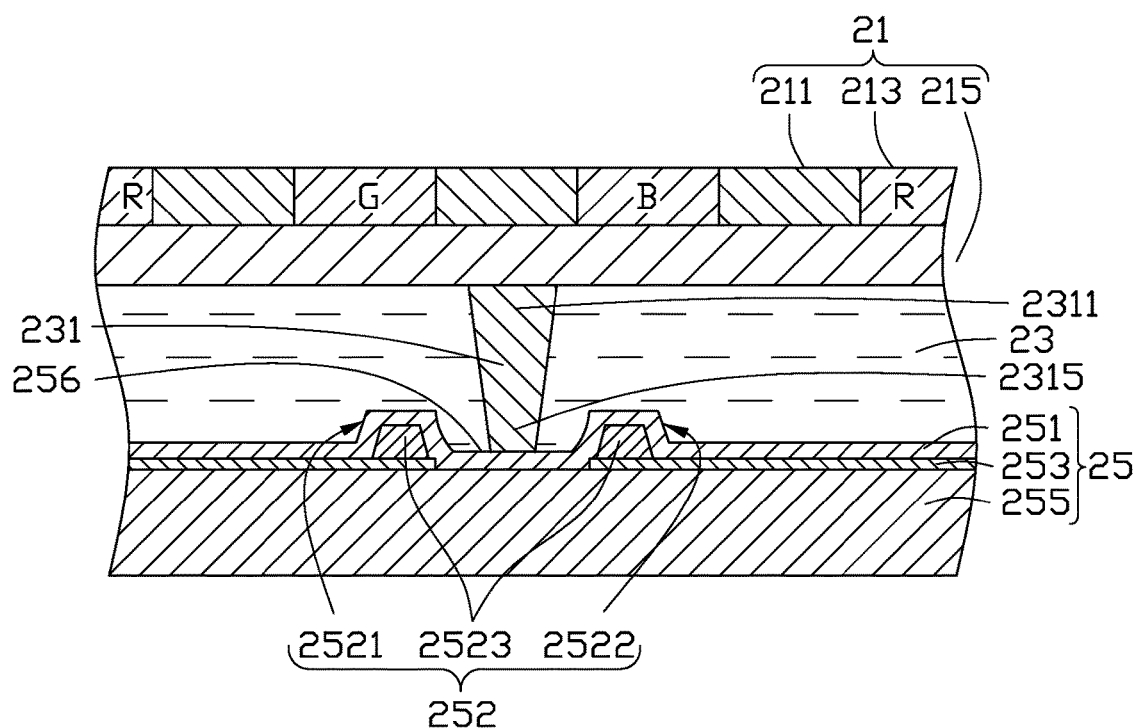
FIG. 3 is a cross-sectional view of the LCD in FIG. 1 along line III-III.

A liquid crystal panel 20 is shown in FIGS. 1-3. FIG. 1 is a partial planar view of the liquid crystal display panel 20 and illustrates physical structure between one of the photo spacers, the block portions relative to one of the photo spacers; FIG. 2 is a cross-sectional view of the LCD in FIG. 1 along the line II-II direction, and FIG. 3 is a cross-sectional view of the LCD in FIG. 1 along the line direction.

Referring to FIG. 2, the liquid crystal panel 20 includes a CF substrate 21, a TFT substrate 25 that is arranged oppositely facing towards the CF substrate 21 with a space, and a plurality of PSs 231 that is located in the liquid crystal layer 23 between CF substrate 21 and TFT array substrate 25.

The CF substrate 21 includes a black matrix 211, a CF unit 213, and a protection layer 215. The CF substrate 21 can also include a top substrate (not shown), that is used for holding the black matrix 211 and the CF units 213.

The TFT array substrate 25 includes an alignment layer 251, a pixel electrode layer 253, a planar layer 255, and a plurality of contact holes 254. Even it is not shown in the figure, the TFT array substrate 25 can also include a bottom substrate, and a TFT array which is formed on the bottom substrate.

The liquid crystal layer is located between the CF substrate 21 and TFT array substrate 25.

In the exemplary embodiment, the protection layer 215 is arranged on the side of the color filter substrate 21 near the liquid crystal layer 23, and the protection layer 215 has a liquid crystal alignment function, that can be fabricated by friction alignment, photo alignment or any other possible alignment process. The CF unit 213 and the black matrix 211 are arranged on the side of the protection layer 215 away from the liquid crystal layer 23, and the CF unit 213 includes three color filter elements, i.e., red (R), green (G), and blue (B) color filter elements. The color filter unit 213 is arranged in the same layer as the black matrix 211, and the black matrix 211 separates the color filter elements of the CF unit 213 so that the red, green, and blue color filter elements of the CF unit 213 are separately arranged. The black matrix 211 is an opaque material that has the effect of light shielding, while the color filter unit 213 is a transparent material that allows only light of the corresponding color to pass through, thereby changing the color of the light out of the color filter unit 213.

The PSs 231 are arranged on the CF substrate 21 to maintain a same cell gap in the liquid crystal layer. One side of PSs 231, which is called top side 2311, contact with the protection layer 215. Another side of PSs 231, that is called bottom side 2315, holds the TFT array substrate 25. In the exemplary embodiment, the size of the top side 2311 is larger than the size of the bottom side 2315. Each PSs 231 is arranged at a corresponding position relative to the black matrix 211 of the CF substrate 21. In other words, the projection plan position of each PS overlaps with the black matrix 211 (not out of the bounds of the black matrix 211). As the black matrix 211 is opaque, if the PSs 231 are arranged at their corresponding positions on the black matrix 211, the influence of the transmittance of liquid crystal panel 20 by PSs 231 can be prevented, and on the other hand, the black matrix 211 can block light leakage due to the alignment layer 251 being damaged by the friction of the bottom of the PSs 2315. In the exemplary embodiment, the projection area of the black matrix 211 at the TFT array substrate 25 is larger than the projection area of the PSs 231 at the TFT array substrate 25.

The alignment layer 251 is arranged on the TFT array substrate 25 that is at the side near the liquid crystal layer 23, and the planar layer 255 is arranged on the TFT array substrate 25 that is at the side away from the liquid crystal layer 23. The pixel electrode 253 is arranged between the alignment layer 251 and planar layer 255. Both of the pixel electrode 253 and the alignment layer 251 are arranged on the surface of the planar layer 255. The alignment layer 251 includes a plurality of contact portions 256, and the pixel electrode layer 253 is not arranged at the corresponding position of the contact portions 256. The bottom of PSs 2315 contacts and/or holds on the contact portions 256 of the alignment layer 251.

As shown in FIGS. 1 and 3, the TFT array substrate 25 also includes block portions 252 (only one shown). Each block portions 252 is arranged near the contact portions 256 and is configured to limit the relative displacements of PSs 231 on the TFT array substrate 25. The block portion 252 is a protrusion formed toward the CF substrate 21 with respect to the contact portion 256, and specifically, a block-shaped or a strip-shaped spacer 2523 having a predetermined thickness is embedded between the pixel electrode layer 253 and the alignment layer 251, so that the alignment layer 251 at the corresponding portions of spacer 2523 is raised toward the CF substrate 21 to form the block portion 252. The spacer 2523 is preferably made of a conductive material, such as metal, and specifically it may be complex metal such as titanium-aluminum. The material of the spacer 2523 may also be other conductive materials such as inorganic or organic materials, for example, graphite or a polymer doped with conductive particles. A surface of the block portion 252 is higher than the surrounding areas so as to form a groove cavity configured to accommodate the end of PSs 2315.

Corresponds to a plurality of optical gaps 231 on the TFT array substrate 25, a plurality of the block portions 252 is present on the TFT array substrate 25. In this exemplary embodiment, the block portion 252 includes a first block portion 2521 and a second block portion 2522. The first block portion 2521 and the second block portion 2522 are distributed on the both sides of each of the contact portions 256 along the first direction (e.g., in the line direction in the FIG. 1). Neither the first block portion 2521 or the second block portion 2522 are in contact with the contact hole. In this exemplary embodiment, the first block portion 2521 has an island shape, and each of the first block portions 2521 is not in contact with each other. The second block portion 2522 has a stripe shape, and the adjacent second block portions 2522 extending in the second direction to form a continuous strip. The second direction is substantially perpendicular to the first direction. The spacer material configured to form the spacers 2523 is located between the alignment layer 251 and the pixel electrode layer 253 in the thickness direction of the TFT array substrate 25. Some portions of the spacers 2523, such as the second block portions 2522 with the strip shape, can be made of conductive material and electrically connected to the pixel electrode layer 253. In the exemplary embodiment, the second block portions 2522 is located at a position closest to a corresponding data line so as to be easier to build a physically connection with an adjacent one of the data lines of the TFT array substrate 25 and therefore serves as a repairing line of the corresponding data lines. In such case, the second block portions 2522 may be formed to overlap the data line or be parallel to the data line with a small gap between the data line and the second block portions 2522. In another exemplary embodiment, the conductive second block portions 2522 may also be not connected to the pixel electrode layer 253 and serves as a sensor electrode of an in-cell touch structure that can be integrated with the TFT array substrate 25.

In other exemplary embodiments, the first block portion 2521 and the second block portion 2522 are island shapes, or both are strip shapes.

The contact holes 254 are formed on the planar layer 255, and a contact hole 254 is distributed at each sides of the contact portion 256 along the second direction (in the direction of line II-II in the FIG. 1) In this exemplary embodiment, the contact hole 254 is used for electrical connection between the pixel electrode of the pixel electrode layer 253 and the drain electrode of the TFT on the TFT array substrate 25 (not shown). For example, the contact hole 254 located on the left side of FIG. 1 can be formed in the upper pixel unit, and the contact hole 254 located on the right side of FIG. 1 can be formed in the bottom pixel unit.

The block portion 252 is higher than the surrounding area, and therefore, the block portion 252 can effectively limit the displacements of the PSs 231 with respect to the TFT array substrate 25, and it is possible to effectively avoid the light leakage caused by the damage of the alignment layer 251 due to the displacement of the PSs 231. Therefore, the quality of the display panel can be improved. At the same time, the spacer 2523 is electrically connected to the pixel electrode layer 253, and the spacer 2523 may also be used as an electrode, for example, as an embedded touch sensing electrode and a common electrode, thereby further simplifying the panel structure.

The Second Exemplary Embodiment

Figure 4:
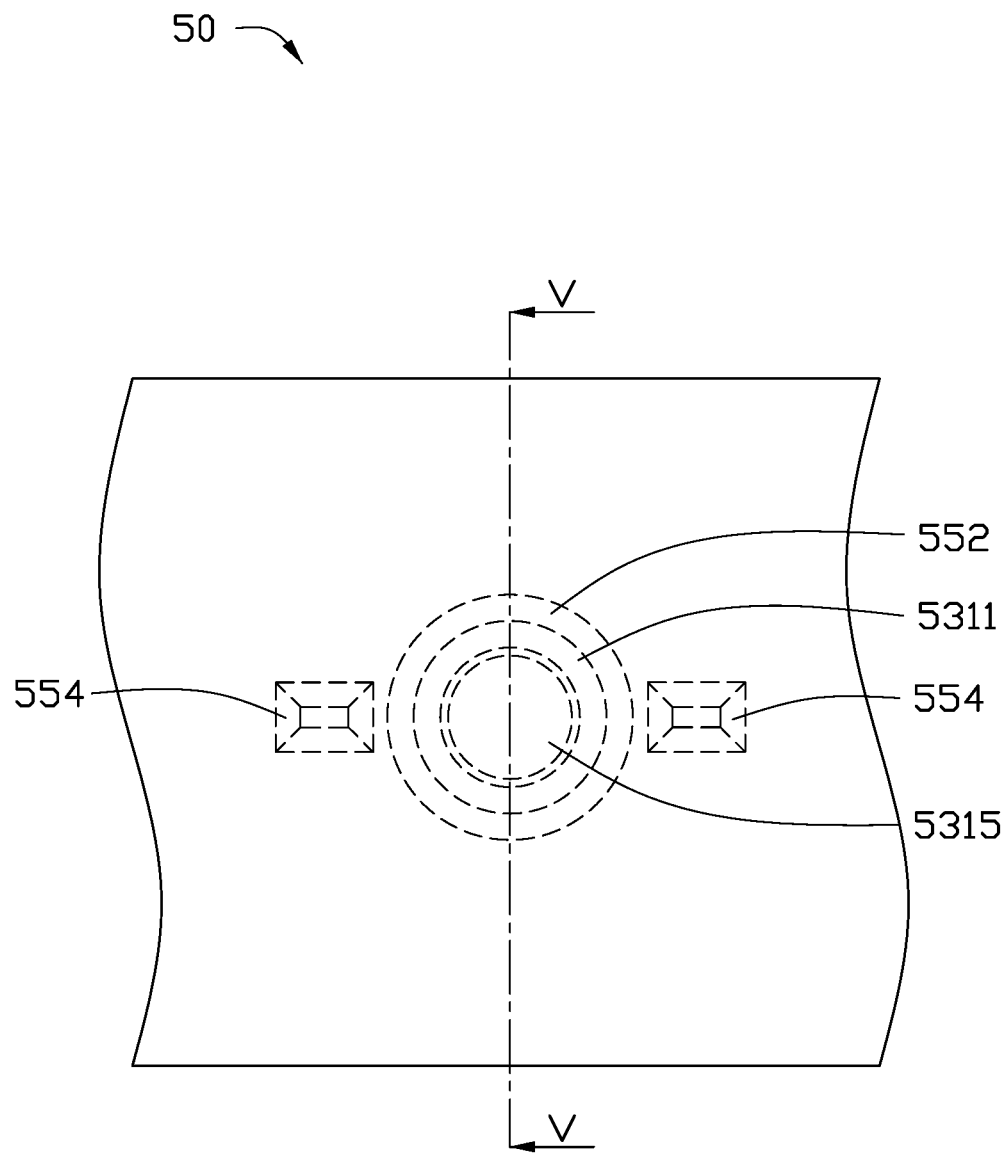
FIG. 4 is a partial planar view of the LCD according to a second exemplary embodiment of the disclosure.
Figure 5:
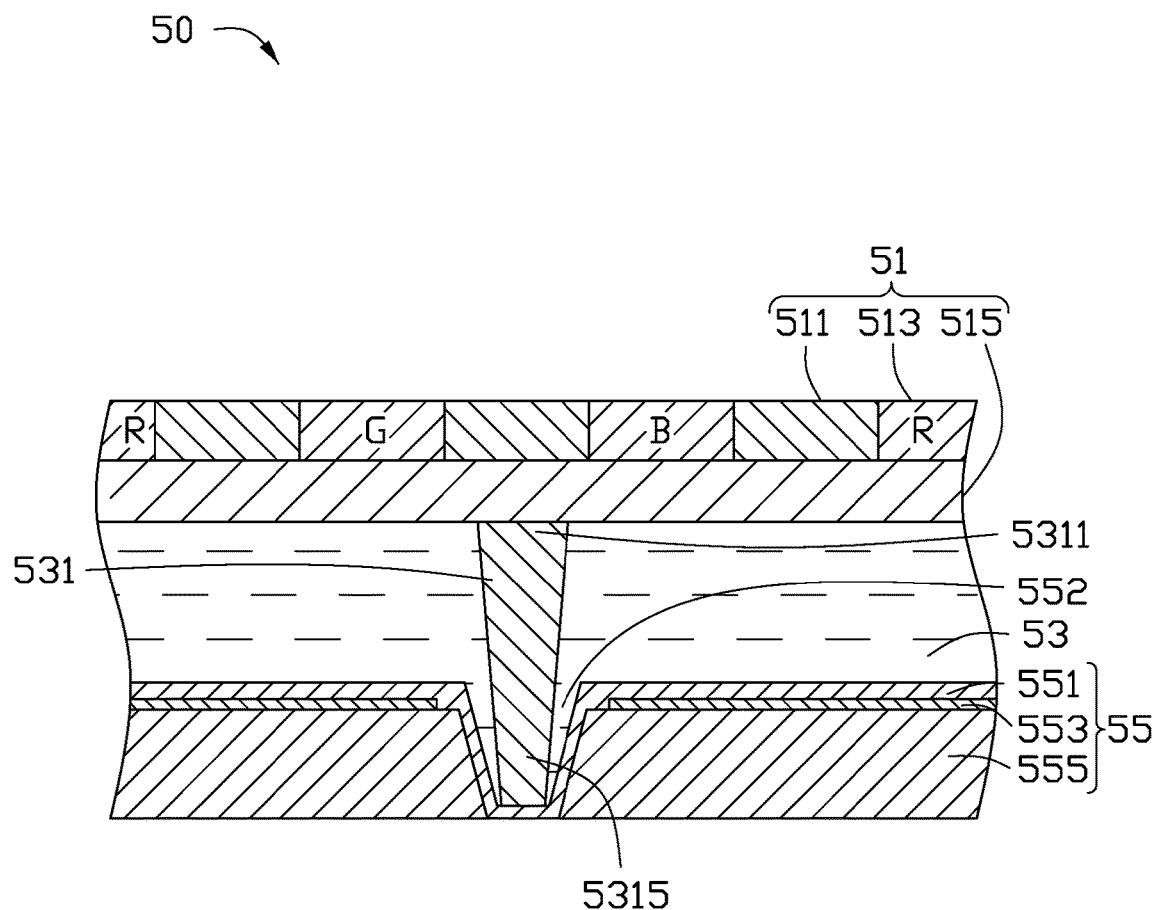
FIG. 5 is a cross-sectional view of the LCD in FIG. 4 along line V-V.

A liquid crystal display 50 in the second exemplary embodiment is as shown in FIGS. 4-5, FIG. 4 is a partial planar view of an LCD in the second exemplary embodiment, and FIG. 5 is a cross-sectional view of LCD in FIG. 4 along line V-V.

The liquid crystal display panel 50 includes a CF substrate 51, a TFT array substrate 55 that is arranged oppositely facing towards to and spaced from the CF substrate 51, a liquid crystal layer 53 that is located between the CF substrate 51 and the TFT array substrate 55, and a plurality of PSs 531 in the liquid crystal layer 53.

The CF substrate 51 includes a black matrix 511, a CF unit 513, and a protection layer 515. Although the figure is not shown, the CF substrate 51 may be also include an upper substrate for carrying the black matrix 511 and the CF unit 513.

The TFT array substrate 55 includes an alignment layer 551, a pixel electrode layer 553, a planar layer 555, and a contact hole 554. Although the figure is not shown, the TFT array substrate 55 may further include a bottom substrate, and a TFT array formed on the bottom substrate.

The liquid crystal layer 53 is filled between the CF substrate 51 and the TFT array substrate 55.

The protection layer 515 is arranged on the side of the color filter substrate 51 near the liquid crystal layer 53, and the protection layer 515 has a liquid crystal alignment function, that can be fabricated by friction alignment, light alignment or any other possible alignment process. The CF unit 513 and the black matrix 511 are arranged on the side of the protection layer 515 far away from the liquid crystal layer 53, and the CF unit 513 includes three color filter elements, i.e., red (R), green (G), and blue (B) color filter elements. The CF unit 513 is arranged in the same layer as the black matrix 511, and the black matrix 511 separates the color filter elements of the CF unit 513 so that the red, green, and blue color filter elements of the CF unit 513 are arranged separated. The black matrix 511 is an opaque material that has the effect of shielding light; the CF unit 513 is a transparent material that allows only light of the corresponding color to pass, thereby changing the color of the light.

The PSs 531 are arranged on the CF substrate 51, and they can keep the liquid crystal layer has the same cell gap. One side of PSs 531, which is called top side 5311, contact with the protection layer 515. Another one side of PSs 531, that is called bottom side 5315, hold the TFT array substrate 55. In this exemplary embodiment, the size of the top side 5311 is greater than the size of the bottom side 5315. Each PSs 531 are arranged at their corresponding position of the black matrix 511 of the CF substrate 51. In other words, the projection plan position of each PSs are overlapping with the black matrix 511 (not out the bounds of the black matrix 511). As the black matrix 511 is opaque, if the PSs 531 are arranged at their corresponding position of the black matrix 511, the influence of the transmittance of liquid crystal panel 50 by PSs 531 can be avoided, and on the other hand, the black matrix 511 can block the light leak due to the alignment layer 551 damaged by the friction of the bottom of the PSs 5315. In this exemplary embodiment, the projection area of the black matrix 511 at the TFT array substrate 55 is larger than the projection area of the PSs 531 at the TFT array substrate 55.

The alignment layer 551 is arranged on the TFT array substrate 55 that is at the side near the liquid crystal layer 53, and the planar layer 555 is arranged on the TFT array substrate 55 that is at the side far away from the liquid crystal layer 53. The pixel electrode 553 is arranged between the alignment layer 551 and planar layer 555. Both of the pixel electrode 553 and the alignment layer 551 are arranged on the surface of the planar layer 255.

As shown in FIG. 4 and FIG. 5, the TFT array substrate 55 further includes a block portion 552. In this exemplary embodiment, a cave that is capable of accommodating at least partial of the PSs 531 is formed on the planar layer 555 near the side of the liquid crystal layer 53. This cave is the block portion 552. The PSs 531, at the side far away from the bottom of the CF substrate 51, is embedded into the block portion 552. The pixel electrode layer 553 is not arranged in the region corresponding to the block portion 552, and the alignment layer 551 extends into a cave, where the block portion 552 is formed.

The contact holes 554 are formed on the planar layer 555, and a contact hole 554 is distributed at each sides of the block portion 552 along the second direction. In this exemplary embodiment, the contact hole 554 is used for electrical connection between the pixel electrode of the pixel electrode layer 553 and the drain electrode of the TFT on the TFT array substrate 55 (not shown).

One end of the PSs 531 is located on the block portion 552. Therefore, the block portion 552 can effectively limit the displacement of the PSs 531 with respect to the TFT array substrate 55, and it is possible to effectively avoid the light leakage caused by the damage of the alignment layer 551 due to the displacement of the PSs 531. Therefore, the quality of the display panel can be improve.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A Liquid Crystal Display (LCD) device comprising:
a thin film transistor (TFT) array substrate;
a liquid crystal layer; and
a plurality of photo spacers;
wherein the photo spacers are located inside the liquid crystal layer;
wherein the TFT array substrate comprises a pixel electrode layer and an alignment layer;
wherein the alignment layer is arranged on the side of the TFT array substrate near the liquid crystal layer; the pixel electrode layer is arranged on a side of the alignment layer away from the liquid crystal layer; the alignment layer comprises a plurality of contact portions; an end of the photo spacers are supporting by the contact portions; the TFT array substrate further comprises a plurality of block portions adjacent to the contact portions; each of the block portions comprises a first block portion and a second block portion separated from the first block portion; the first block portion and the second block portion of each of the block portions form a groove cavity to accommodate at least partial portion of one of the photo spacers; a portion of the alignment layer located at the bottom of the groove cavity defines the contact portion, the partial portion of the one of the photo spacers contacts with the contact portion located in the groove cavity.

2. The LCD device of claim 1, wherein the block portions make a surface near the contact portions protruding out of surrounding areas of the TFT array substrate.

3. The LCD device of claim 2, wherein each of the block portions comprises a spacer, the spacer is embedded between the alignment layer and the pixel electrode layer in a thickness direction of the TFT array substrate, so that the block portion is higher than the surrounding area.

4. The LCD device of claim 3, wherein at least one part of the spacer is made of conductive material.

5. The LCD device of claim 4, wherein the spacer is an embedded touch sensing electrode of the LCD device.

6. The LCD display device of claim 3, wherein the first block portion is located on one side of the contact portion and the second block portion is located on another side of the contact portion.

7. The LCD device of claim 3, wherein the first block portion has an island shape, the second block portion has a strip shape, and the second block portion extends in a first direction to form a continuous strip.

8. The LCD device of claim 7, wherein the second block portion is made of conductive material and is connected to the pixel electrode layer.

9. The LCD device of claim 7, wherein the TFT array substrate further comprises a planar layer and a plurality of contact holes; the planar layer is arranged on the side of the TFT array substrate away from the liquid crystal layer; the contact holes are arranged on the planar layer, the contact holes are arranged on both side of the contact portion along a second direction, the second direction is perpendicular to the first direction.

10. The LCD device of claim 1, wherein the LCD further comprises a color filter substrate arranged oppositely facing towards and spaced from the TFT array substrate, the color filter substrate comprises a black matrix, the black matrix is arranged corresponding to the photo spacers, and the projection of each photo spacer on the color filter substrate overlaps with the black matrix.

11. The LCD device of claim 1, wherein the TFT array substrate further comprises a planar layer; the planar layer is arranged on the side of the TFT array substrate away from the liquid crystal layer so as to define a planar surface.

12. The LCD device of claim 11, wherein each block portion is a cave recessed downward relative to the planar surface defined by the planar layer, and the cave forms the groove cavity.

* * * * *